(12) United States Patent
Rockwell

(10) Patent No.: US 9,622,336 B2
(45) Date of Patent: Apr. 11, 2017

(54) RELEASABLE PROBE CONNECTION

(71) Applicant: Tektronix, Inc., Beaverton, OR (US)

(72) Inventor: Martin Rockwell, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 184 days.

(21) Appl. No.: 14/063,242

(22) Filed: Oct. 25, 2013

(65) Prior Publication Data

US 2015/0114685 A1 Apr. 30, 2015

(51) Int. Cl.
*H05K 1/02* (2006.01)
*G01R 1/04* (2006.01)
*G01R 31/28* (2006.01)

(52) U.S. Cl.
CPC ............. *H05K 1/02* (2013.01); *G01R 1/0416* (2013.01); *G01R 31/2886* (2013.01); *G01R 31/2889* (2013.01)

(58) Field of Classification Search
None
See application file for complete search history.

(56) References Cited

U.S. PATENT DOCUMENTS

| | | | |
|---|---|---|---|
| 3,953,797 A | 4/1976 | Bally Berard et al. | |
| 5,202,622 A | 4/1993 | Cole | |
| 6,060,894 A | 5/2000 | Hembree et al. | |
| 6,323,670 B1 | 11/2001 | Lee | |
| 6,407,568 B1 * | 6/2002 | Mulligan | G01R 1/06705 324/750.22 |
| 2004/0046583 A1 * | 3/2004 | Fan | G01R 1/0466 324/756.02 |
| 2004/0155328 A1 | 8/2004 | Kline | |
| 2009/0284268 A1 * | 11/2009 | Burt | G06F 11/2733 324/555 |
| 2014/0055159 A1 * | 2/2014 | Shelsky | G01R 1/0408 324/756.07 |

FOREIGN PATENT DOCUMENTS

WO 2008011106 A2 1/2008

OTHER PUBLICATIONS

European Patent Office, EP Serial No. 14190306.2-1560, Extended European Search Report, 6 pages, Mar. 9, 2015, European Patent Office, Munich, Germany.

* cited by examiner

*Primary Examiner* — Jermele M Hollington
*Assistant Examiner* — Douglas X Rodriguez
(74) *Attorney, Agent, or Firm* — Michael A. Nelson; Kevin D. Dothager; Marger Johnson

(57) ABSTRACT

A test and measurement probe connection system including an interposer, at least one probe tab connected to the interposer, and a connector that is releasably connectable to the at least one probe tab to measure signals from the interposer.

20 Claims, 3 Drawing Sheets

RELEASABLE PROBE CONNECTION

TECHNICAL FIELD

This disclosure relates to a test and measurement probe connection system. The system includes a probe tab connected to a circuit, and a connector that can be releasably attached to the probe tab in order to measure signals on the circuit.

BACKGROUND

Interposers are devices that are typically inserted between a memory integrated circuit (IC) chip and the printed circuit board that the memory IC chip normally mounts on. The interposers are small printed circuit boards or flexible circuits that sample the signals between the memory IC chip and the printed circuit board. A test and measurement instrument, such as an oscilloscope, can be connected to the interposer through a probe to measure the signals.

Typically, the test and measurement instrument is connected to the interposer through a browser probe or a solder down probe tip. An example of a set up for a solder down probe is shown in FIG. 1, which is not drawn to scale. An interposer 100 is mounted on a printed circuit board 102. The memory IC chip 104 is on top of the interposer 100. A solder point 106 is provided on the interposer to solder the probe tip of the test and measurement instrument. Solder down probes are difficult to use due to the small geometry and high bandwidths needed for modern memory systems. Browser probes are also difficult to use because the browser probes need to be held in place on the interposer and also may have a lower bandwidth than solder down probes. What is needed is an easily connectable probe to an interposer to quickly and accurately sample the signals between the memory IC chip and a printed circuit board.

SUMMARY

Certain embodiments of the disclosed technology include a test and measurement probe connection system including an interposer, at least one probe tab connected to the interposer, and a connector that is releasably connectable to the at least one probe tab to measure signals from the interposer.

Certain embodiments include a test and measurement probe connection system including a circuit, at least one probe tab connected to the circuit, and a connector that is releasably connectable to the at least one probe tab to measure signals from the circuit.

DETAILED DESCRIPTION

Figure 1:
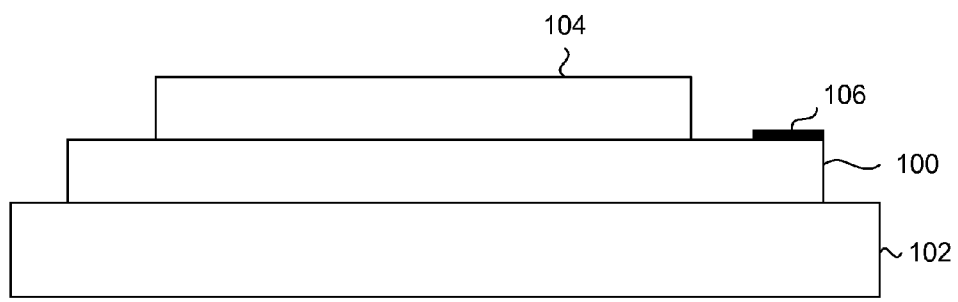
FIG. 1 illustrates an example of a traditional interposer with a soldering point for a solder down probe tip.

In the drawings, which are not to scale, like or corresponding elements of the disclosed systems and methods are denoted by the same reference numerals.

Figure 2:
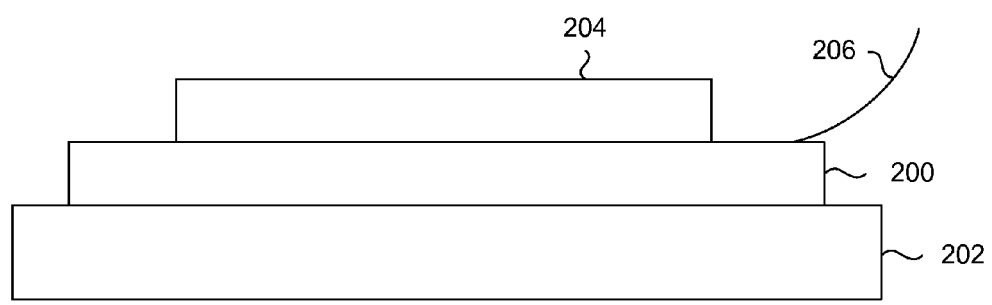
FIG. 2 illustrates an example of an interposer with a probe tab of the disclosed technology.

The technology disclosed herein eliminates the need for browser probes and solder down probes to measure signals on various circuits. FIG. 2 illustrates an interposer 200 located between a circuit 202 and a memory IC chip 204. Rather than a soldering point on the interposer to attach a solder down probe, a probe tab 206 is attached to the interposer 200. The probe tab 206 is part of the interposer 200. The probe tab 206 allows a test and measurement instrument to sample a signal from the memory IC chip 204 placed on top of the interposer 200. As will described in further detail below, a connector, which is attached to a test and measurement instrument, can easily be releasably connected to read signals from interposer 200.

Figure 3:
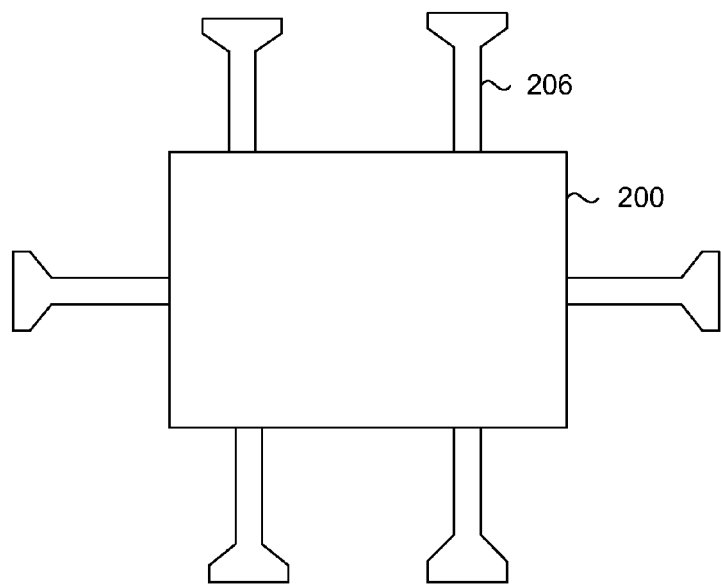
FIG. 3 illustrates an interposer with multiple probe tabs attached.

FIG. 3 illustrates an example of an interposer 200 with six probe tabs 206. The probe tabs 206 are preferably manufactured as part of the interposer 200. That is, probe tabs 206 are integrally formed with the interposer 200. The probe tabs 206, however, may also be soldered onto the interposer 200 during manufacturing or by a user.

Each probe tab 206 allows a different signal to be measured of the IC chip or circuit that is connected to the interposer 200. Although FIG. 3 illustrates six probe tabs 206, the disclosed technology is not limited to six probe tabs 206. A single probe tab 206 could be used as shown FIG. 2 or any number of probe tabs that can fit and are needed on an interposer. Each probe tab 206 brings out a desired signal from the circuit, as will be discussed in more detail below. The probe tabs 206 are used in a similar manner as the soldering points 106 are used in traditional interposers 100.

Figure 4:
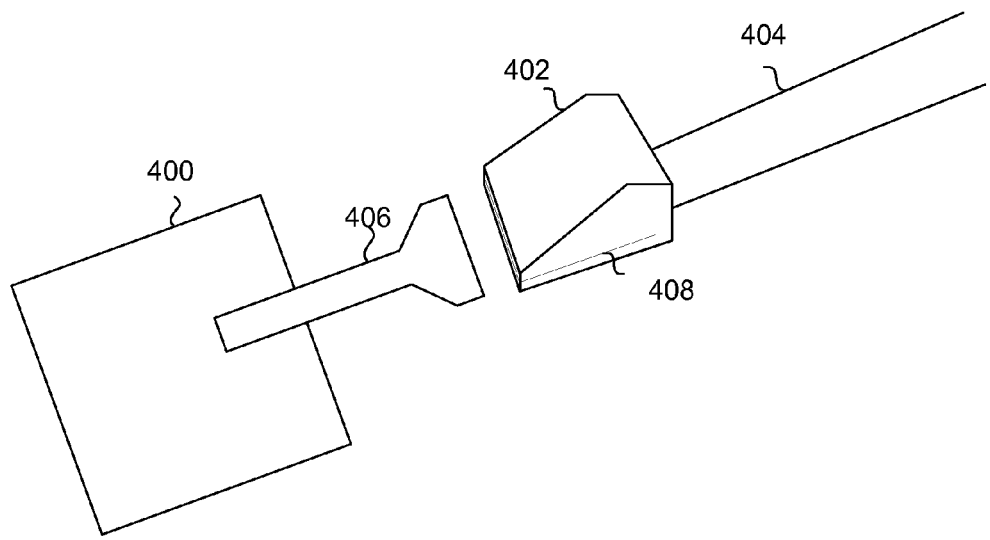
FIG. 4 illustrates a probe tab connection system for connecting a connector to a probe tab.

FIG. 4 illustrates the connection between a probe tab 406 and a connector 402. The probe tab 406, as shown in FIG. 4, is attached to a circuit 400 to bring out a desired signal from the circuit. Probe tab 406 works the same as probe tab 206 described above. For example, the circuit 400 may be an interposer, as discussed above. Connector 402 can then be releasably attached to the probe tab 406 to measure the signal from the circuit 400. Then, if it is desired for another signal to be measured, the connector 402 can be removed from the current probe tab 406 and placed on another probe tab 406. This eliminates the need for a solder down probe and allows a user to easily measure a desired signal without requiring the skills of being able to solder the solder down probe to the interposer.

Although FIG. 4 shows a single probe tab 406 and a single connector 402, the disclosed technology can have multiple probe tabs 406 on the circuit 400, similar to that shown in FIG. 3. Further, multiple connectors 402 can be used as well, each connector 402 connected to a different probe tab.

Connector 402 is attached to the end of a coaxial or flex cable assembly 404 which connects back to a test and measurement instrument (not shown). Multiple coaxial or flex cable assemblies 404 can be provided. Each of the coaxial or flex cable assembles 404 having a connector 402 at the end to measure signals from the probe tabs 406 are attached to a test and measurement signals and allows for multiple signals to be measured at once.

Connector 402, as mentioned above, is releasably connectable to a probe tab 406. This can be done a variety of ways. The connector 402 can have a slot 408 to insert the probe tab 406, as shown in FIG. 4. In another embodiment, the top of the connector 402 can be opened and the probe tab 406 can be placed inside the connector 402. Then the top of connector 402 can be clamped down on the probe tab 406. In order to remove the probe tab 406, the top of the connector 402 merely needs to be opened again. The connector 402 being releasably attached allows a user to quickly and efficiently measure signals without requiring the skills to solder a solder down probe tab on to a small interposer or circuit.

Further, the probe tabs 206 and 406 and connector 402 are built to withstand higher bandwidths and allow a user to be able to accurately sample or measure signals from circuits with higher bandwidths.

Probe tabs 206 and 406 are preferably a flexible circuit attached to the interposer 200. Probe tab 206, however, can also be printed circuit boards attached to the interposer 200 or circuit 400. The probe tab 206 must be able to releasably connect with the connector 402. The probe tab 206 has electrical leads thereon to direct the signals sampled from the memory IC chip 204 through the interposer 200 to the end of the probe tab 206. The connector, described in more detail below with respect to FIG. 4, can releasably attach to the probe tab 206 and read the signal that traveled through the electrical lead on the probe tab 206.

Figure 5:
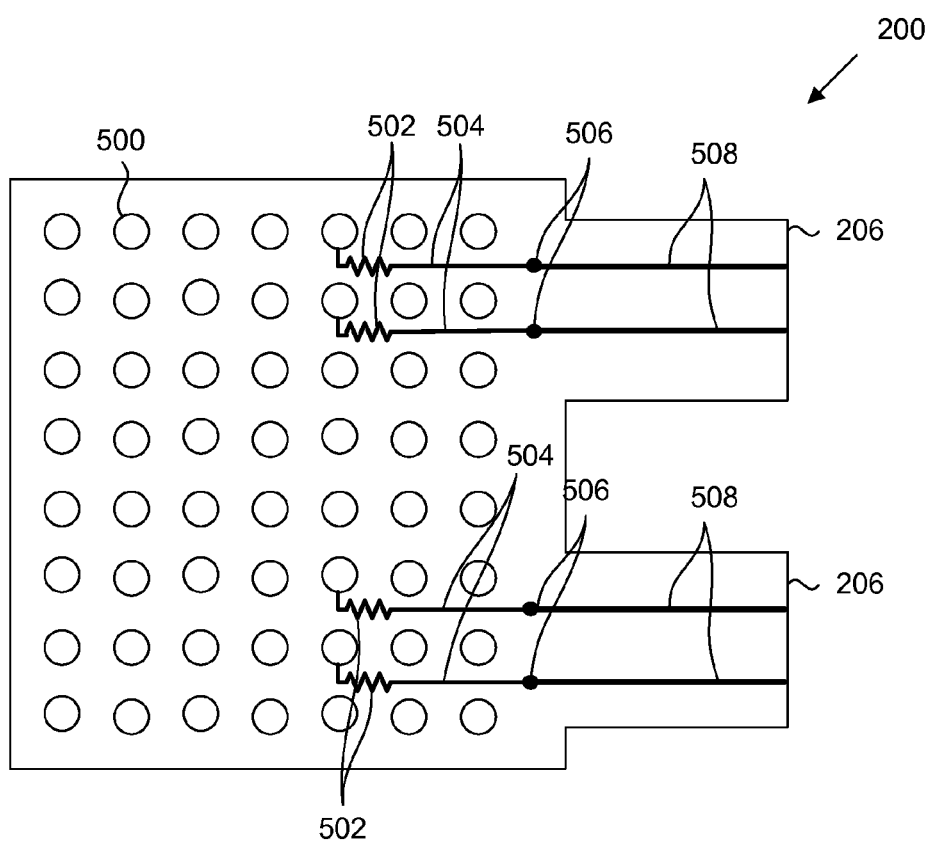
FIG. 5 illustrates an interposer of the disclosed technology.

FIG. 5 shows an example of an interposer 200. The interposer 200 includes a variety of vias or solder pads 500, which are used to mount an IC chip, such as the memory IC chip 204 discussed above. The interposer 200 also includes probe tabs 206. The interposer 200 also includes internal resistors 502 shown in FIG. 5. The internal resistors 502 are connected to an internal metal trace 504 on the interposer 200. This internal metal trace 504 is connected to a via 506 and a surface metal trace 508. The signal from the memory IC chip 204 travels from the internal resistor 502, through internal metal trace 504 to the surface metal trace 508 through via 506.

Connector 402 includes two conductors (not shown). The two conductors align with the surface metal trace 508 on the probe tabs 206. The signal on the surface metal trace 508 is then sent to the test and measurement instrument through the two conductors in the connector 402.

Although an interposer in use with a memory IC chip has been discussed above, the disclosed technology is not limited to such an embodiment. An interposer with probe tabs can be used with any IC chip. Further, the disclosed technology is not limited to use with an interposer. Rather, the technology can be used with any type of circuit in which it is desirable to measure a signal within the circuit. A probe tab can attached to the circuit and the connector can connect to the probe tab to measure the signal. The disclosed technology allows for signals to be measured within small spaces without having to solder down a probe tab or hold a browser probe tab. A user can quickly measure a variety of signals within a circuit by merely placing the connector on a probe tab, measuring the signal, and then disconnecting the connector and placing it on the next probe tab.

Further, the probe tabs 206 can take on any shape as long as they can connect to a connector 402. The shape of the probe tabs 206 and 406 does not matter. For example, the shape can be as seen in FIGS. 3 and 4, or the probe tabs 206 and 406 can take on a simpler shape of a rectangle as shown in FIG. 5.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

What is claimed is:

1. A test and measurement probe connection system, comprising:
    an interposer configured to be disposed directly between a circuit board and an integrated circuit chip to enable transmission of a plurality of signals between the circuit board and the integrated circuit chip, the interposer including a probe tab configured to have releasable connectors connected thereto, the probe tab having electrical leads on an exposed surface of the probe tab, the electrical leads configured to receive a signal, of the plurality of signals transmitted between the circuit board and the integrated circuit chip; and
    a connector that is releasably connectable to the at least one probe tab, the connector having conductors configured to align with the electrical leads on the probe to enable the signal to be sent to a test and measurement system, for measurement, the test and measurement system being independent of the circuit board and the integrated circuit chip.

2. The test and measurement probe connection system of claim 1, wherein the probe tab is a first probe tab and the signal is a first signal, the interposer further comprising a second probe tab configured to receive a second signal, of the plurality of signals, the second signal and the first signal being different from one another.

3. The test and measurement probe connection system of claim 2, wherein the connector is configured to be removable from the first probe tab and releasably connected to the second probe tab to enable measurement of the second signal.

4. The test and measurement probe connection system of claim 2, wherein the connector is a first connector further comprising a second connector, the first and second connectors are each releasably connectable to the first and second probe tabs to enable simultaneous measurement of the first and second signals.

5. The test and measurement probe connection system of claim 1, wherein the probe tab is a flexible circuit.

6. The test and measurement probe connection system of claim 1, wherein the probe tab is a printed circuit board.

7. The test and measurement probe connection system of claim 1, wherein each of the electrical leads are coupled with a respective internal resistor.

8. The test and measurement probe connection system of claim 1, wherein the probe tab is configured to engage the connector via a slot in the connector.

9. The test and measurement probe connection system of claim 1, wherein the probe tab is configured to have the connector clamped thereon.

10. An interposer comprising:
    a first surface configured to be electrically coupled with a circuit board;
    a second surface configured to be electrically coupled with an integrated circuit chip, the interposer configured to be disposed between the circuit board and the integrated circuit chip to receive a plurality of signals transmitted between the circuit board and the integrated circuit chip; and
    a probe tab configured to be releasably connected to a connector of a test and measurement system, the test and measurement system being independent of the circuit board and the integrated circuit chip, the probe tab having a pair of surface metal traces that are to respectively align with a pair of conductors of the connector to electrically couple the interposer to the test and measurement system to enable a signal, of the plurality of signals, associated with the probe tab to be sent to the test and measurement system for measurement.

11. The interposer of claim 10, wherein the probe tab is one of a plurality of similar configured probe tabs, each probe tab associated with a respective signal of the circuit or the integrated circuit chip.

12. The interposer of claim 10, wherein the probe tab is a flexible circuit.

13. The interposer of claim 10, wherein the probe tab is a printed circuit board.

14. The interposer of claim 10, wherein the probe tab is manufactured as part of the interposer.

15. The interposer of claim 10, wherein the probe tab is soldered onto the interposer.

16. The interposer of claim 10, wherein the probe tab is configured to engage the connector via a slot in the connector.

17. The interposer of claim 10, wherein the probe tab is configured to have the connector clamped thereon.

18. The interposer of claim 10, further comprising additional probe tabs, each of the additional probe tabs including an additional pair of surface metal traces.

19. The interposer of claim 18, wherein each additional pair of surface metal traces is configured to receive a respective signal, of the plurality of signals, such that each probe tab enables a different signal, of the plurality of signals, to be sent to the test and measurement system for measurement.

20. The interposer of claim 18, further comprising a plurality of resistors, wherein each surface metal trace is coupled with a respective resistor, of the plurality of resistors.

\* \* \* \* \*